United States Patent [19]

U

[11] 4,086,694
[45] May 2, 1978

[54] METHOD OF MAKING DIRECT METAL CONTACT TO BURIED LAYER

[75] Inventor: Aung San U, Rangoon, Burma

[73] Assignee: International Telephone & Telegraph Corporation, Nutley, N.J.

[21] Appl. No.: 752,214

[22] Filed: Dec. 17, 1976

Related U.S. Application Data

[62] Division of Ser. No. 578,774, May 19, 1975, abandoned.

[51] Int. Cl.$^2$ ............................................. B01J 17/00
[52] U.S. Cl. ........................................ 29/579; 29/580; 29/589; 96/36.2
[58] Field of Search ................. 29/578, 579, 589, 580; 96/36, 36.2; 156/656, 657, 659

[56] References Cited

U.S. PATENT DOCUMENTS

| | | | |
|---|---|---|---|
| 3,457,631 | 7/1969 | Hall | 29/579 |
| 3,518,509 | 6/1970 | Cullis | 357/23 |
| 3,760,239 | 9/1973 | Fletcher | 357/47 |
| 3,768,150 | 10/1973 | Sloan | 29/578 |
| 3,908,262 | 9/1975 | Stein | 29/579 |
| 3,913,124 | 10/1975 | Roberson | 357/55 |
| 4,005,452 | 1/1977 | Cook | 29/578 |

Primary Examiner—W. Tupman
Attorney, Agent, or Firm—John T. O'Halloran; Peter C. Van Der Sluys

[57] ABSTRACT

An integrated circuit having a direct metal contact to a buried layer is fabricated by first diffusing said buried layer into a substrate and growing thereon an epitaxial layer. After emitter diffusion into the epitaxial layer and emitter oxidation, a sink hole is etched through the oxide mask, the epitaxial layer, and into the buried layer. An oxide layer is then grown over the surface of the sink hole; which oxide layer is then coated with a negative photoresist. The negative photoresist is exposed to collimated light at an incident angle which results in an unexposed area of photoresist at the bottom of the sink hole. The unexposed area is washed off during developing and the exposed oxide etched away, thereby exposing the buried layer. A metal may be deposited, for example, by evaporation, thus creating a direct metal contact to the buried layer. Also, similar techniques with appropriate variations can be used for direct metal contact to the substrate from the top of the wafer, especially significant whenever insulator isolation processes are employed.

10 Claims, 25 Drawing Figures

METHOD OF MAKING DIRECT METAL CONTACT TO BURIED LAYER

This is a division of application Ser. No. 578,774, filed May 19, 1975, now abandoned.

BACKGROUND OF THE INVENTION

This invention relates generally to a method for providing a metal contact to a buried layer of a semiconductor device and, more particularly, to the fabrication of an integrated circuit having electrical isolation between functional elements thereof and metal contacts which directly contact a buried layer.

Heretofore, a number of methods have been used to provide contacts to buried layers in semiconductor devices; however, most of these have been proven to be disadvantageous in various respects.

In a first method, one in which a P-type epitaxial layer is grown over an N+ type buried layer, which may serve for example as the collector of a transistor, it is necessary to deep-diffuse a region through the P-type epitaxial layer in order to contact the buried layer. This is commonly referred to as sink-diffusion. However, this is a high temperature step normally taking place at a temperature of approximately 1,000° C for a period of a few hours. It is well known that any high temperature step can be damaging during the fabrication of semiconductor devices since severe stresses are placed on the devices, resulting in a reduced yield. Further, when using a deep-diffusion (sink-diffusion) technique, it is necessary that the buried layer be doped with a dopant which will only minimally be affected by the subsequent high temperature deep diffusion process. An example of a dopant compatible with the deep diffusion process would be antimony.

In a second method, when dealing with an N-type epitaxial layer, deep diffusion is not necessary and contact may be made to the top of the N-type epitaxial layer. However, since the N-type epitaxial layer normally has a low impurity concentration, it is necessary to contact large areas of the buried collector, thereby increasing collector resistance.

Neither of the above described approaches are suitable for making a low-noise device. Thus, all the prior art methods suffer from some deficiency. They are either time-consuming, damaging to the semiconductor material due to excessive exposure to extreme temperatures thereby reducing yield, or require large contact areas which in turn reduces design densification of devices.

SUMMARY OF THE INVENTION

It is an object of the present invention to provide direct metal contacts to buried layers in semiconductor devices.

It is a further object of the present invention to provide for the fabrication of a semiconductor device employing direct metal contacts to buried layers and at the same time reduce the number of masking and diffusion steps necessary.

It is a further object of the invention to provide a semiconductor device which employs isolation between active elements using anodized aluminum as a dielectric and direct aluminum contacts to buried layers.

According to a broad aspect of the invention, there is provided a method of providing a direct metal contact to a first region of a semiconductor device of the type wherein an intermediate layer of semiconductive material having a first conductivity is formed over said first region having a second conductivity type, thereby forming a pn junction comprising: removing said intermediate layer in a preselected area forming a moat having side walls, said moat extending into said first region and exposing a surface of said first region and said pn junction; forming a layer of dielectric material on said walls of said moat to electrically isolate said exposed pn junction; and depositing a metal into said moat, said metal making direct contact with said exposed surface for forming said direct metal contact.

According to a further aspect of the invention, there is provided a semiconductor device, comprising: a first region of semiconductive material of a first type conductivity; an intermediate layer of semiconductive material disposed on said first region, said intermediate layer having a second type conductivity and forming a junction with said first region of opposite conductivities; a first metal region extending through said intermediate layer and contacting said first region; and means for electrically isolating said first metal region from said junction.

Another object of the present invention is to provide a semiconductor device that is less expensive and more reliable than those heretofore provided.

The above and other objects of the present invention will be better understood from the following detailed description taken in conjunction with the accompanying drawings in which:

DESCRIPTION OF THE PREFERRED EMBODIMENT

As stated above, the inventive technique of contacting a buried layer of a semiconductor device will be described as taking place during the fabrication of a semiconductor integrated circuit employing anodized aluminum isolation ($A^2I$). It should be understood at the outset, however, that the technique of making direct contacts to buried layers has application to any situation in which a buried layer must be contacted and is not restricted to use in conjunction with anodized aluminum isolation. Since making direct aluminum contacts to buried layers is a technique most compatible with the production of semiconductor devices on integrated circuits employing anodized aluminum isolation, it will be described in conjunction with an A²I approach.

In U.S. Pat. No. 4,005,452 issued Jan. 25, 1977 and assigned to the assignee of the present invention, the problem of providing electrical isolation between active elements is solved by selectively anodizing aluminum which has been deposited in isolation moats. Once the aluminum is selectively anodized, removal of the unanodized aluminum is accomplished using compounds that will attack the pure metal, while having very little effect on the anodized metal. Thus the need for polishing or lapping, generally required in prior art isolation techniques, is eliminated.

For a clear understanding of the invention, it is deemed necessary that a short description of the A²I technique be provided. A more complete discussion can be found in the above cited application.

A double epitaxial layer of N-type semiconductor material can be grown on a P-type substrate. One of said epitaxial layers adjacent the P-type substrate is provided with a high concentration of N-type impurities to provide collector elements with low resistance. The outer surface of the epitaxial layer is oxidized to form a protective dielectric layer of oxide. The oxide layers and the epitaxial layer are etched away at selected isolation regions between the collectors of active elements to expose a portion of the substrate and thereby create isolation moats. Thereafter, aluminum is evaporated onto the surface, said evaporation being conducted at a low temperature in order to minimize degradation of the semiconductor material. Preferably, the aluminum layer evaporated has a thickness which is equal to approximately two-thirds the thickness of the isolation moat depth. This is so because during anodization, the anodized aluminum will increase in volume by a factor of approximately 1.5 and therefore the surface of the anodized aluminum will be level with the surface of the epitaxial layer.

It has been determined that a porous anodic film may be formed from aluminum if any of the following electrolytes are used: sulfuric, phosphoric, oxalic or chromic acids. The concentration of the electrolyte solution may vary beyond the thickness of the layer to be established and other design considerations. For example, if a film having a thickness of 7 to 8 microns is desired, a solution containing 4,228 ml of deionized water, 660 ml of sulfuric acid and 56 grams of oxalic acid is suitable. The solution is maintained at a temperature between 0° to 10° C and a potential of 10 to 50 volts applied across the electrodes to provide an initial current density of 216 ma/in². The applied potential will be dictated by design criteria.

Figure 1:
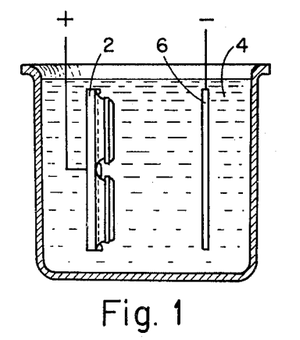
FIG. 1 is a diagrammatic representation of the step of anodizing aluminum on an integrated circuit.
Figure 2:
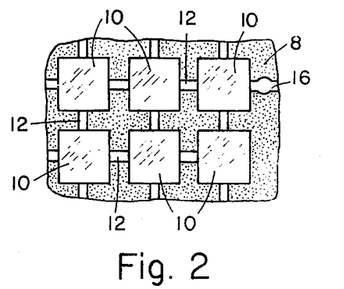
FIG. 2 is a planned view of a portion of a slice of semiconductive material having a plurality of integrated circuit elements formed thereon with an interconnecting ground bus.

FIG. 1 is an illustration of how anodization can be accomplished. The semiconductor device 2 is submerged in an anodizing solution 4 containing an electrolyte. The cathode 6 is also submerged in the solution. During anodization, the metal in the isolation moats forms the anode. This may be accomplished by applying a positive potential directly to the metal in the isolation moats. If application of the positive potential must be made to the metal, it would be most inconvenient to contact each of the isolation moats separately. Therefore, FIG. 2 shows a slice of semiconductor material 8 having thereon a plurality of integrated circuit devices 10 with channels 12 of metal interconnecting each of said devices. Channels 12 are merely extensions of the metal in the isolation moats. A single contact point 16 is provided for applying the anodizing potential to all of the circuits on slice 8. As will be described below, in fabricating a direct aluminum contact to a buried layer, the aluminum contact is not interconnected with those aluminum regions which are to be anodized for isolation purposes, and thus will not be anodized.

The following is a description of the fabrication of a semiconductor device employing direct metal contacts to buried layers. The technique will be described in conjunction with an anodized aluminum isolation technique for the sake of simplicity only. It is to be repeated that the making of direct metal contacts to buried layers is not restricted to the fabrication of devices wherein electrical isolation between active elements is provided by anodized aluminum.

Figure 3:
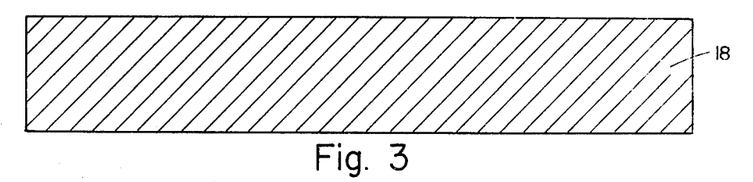
FIGS. 3–16 are cross-sectional views of a portion of an integrated circuit shown at various stages of fabrication in accordance with a first embodiment of the present invention.

Referring to FIG. 3, there is shown a substrate 18 formed of a standard slice of semiconductor material, preferably silicon, having a P-type semiconductivity and a resistivity of approximately 1 ohm cm; however, it is to be understood that an N-type semiconductivity material could also be used.

Figure 4:
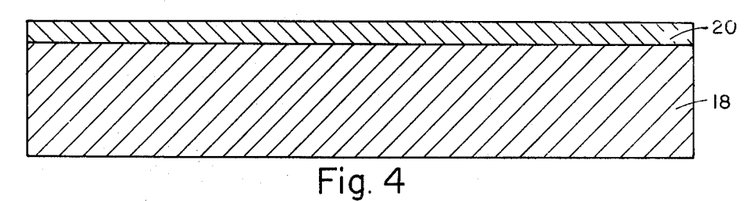

The substrate 18 is then subjected to an oxidizing process so as to form a dielectric oxide layer 20 over the substrate 18. This is shown in FIG. 4.

Figure 5:
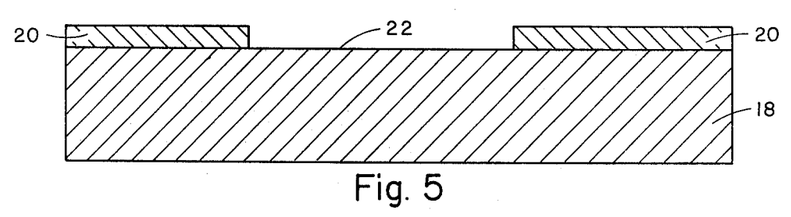

Next, using a conventional process, such as a standard photoresist and etching process, a selected region 22 of layer 20 is removed by etching, exposing the surface of substrate 18. The remaining portions of layer 20 form a mask as shown in FIG. 5.

Figure 6:
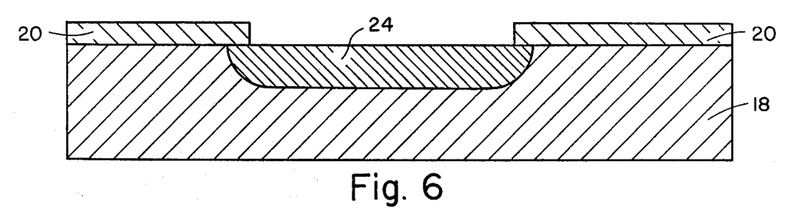

Using layer 20 as a mask, an N+ buried layer 24 is diffused into substrate 18. Buried layer 24 will form the collector of the transistor to be formed. The structure thus far is shown in FIG. 6. Since, using standard contacting methods, the device had to be subjected to a high temperature process during which deep diffusion of an N+ sink region took place (normally at a temperature of 1,000° C), antimony was used as a dopant for N+ region 24 due to the fact that antimony did not appreciably diffuse until a temperature of 1,250° C was achieved. However, as will be described below, the high temperature deep-sink diffusion step has been eliminated, therefore permitting the use of other dopants, such as phosphorus, for buried layer 24.

While oxidizing the semiconductive material 18 is the preferred method for providing dielectric layer 20, the layer may be formed by deposition of silica nitride or an oxide that is both dielectric and resistant to silicon etch.

Figure 7:
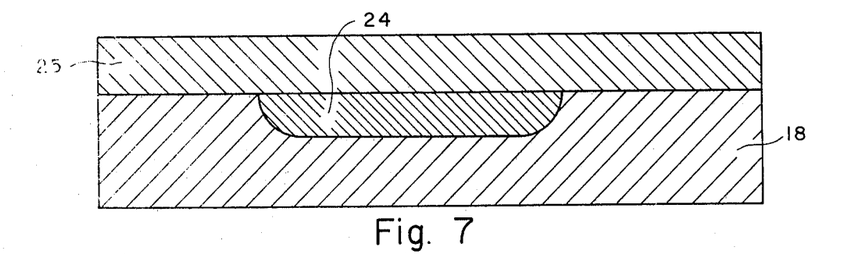

Next, as shown in FIG. 7, the remaining portions of oxide layer 20 are removed, and a P-type epitaxial layer 25 is grown using impurity atoms of boron or any other well-known P-type impurity which provides for the P-type semiconductivity of the layer. The epitaxial process takes place at a temperature of approximately 980° C. The growth is continued to provide a layer having a thickness of approximately 2 to 4 μm ± 0.1 μm.

Figure 8:
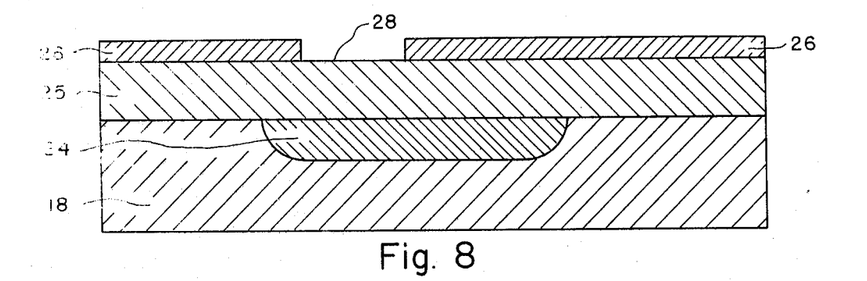
Figure 9:
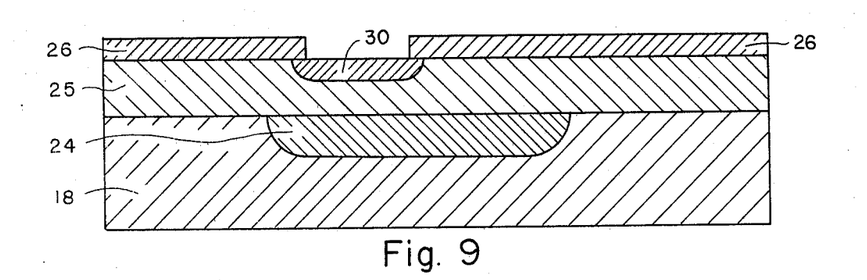
Figure 10:
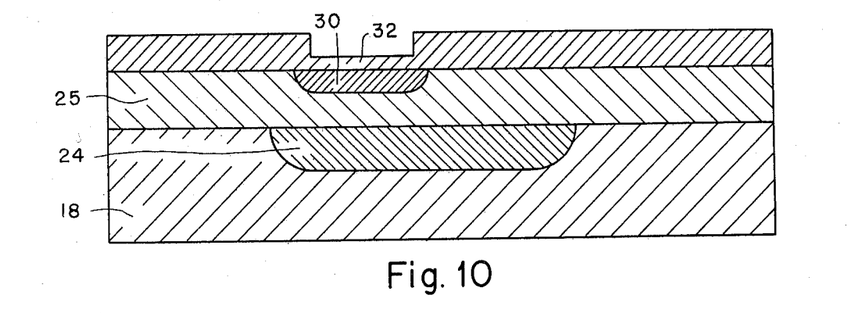

Next, as shown in FIG. 8, an oxide layer of 26 is formed on the surface of epitaxial layer 24, and using conventional processes, a selected region 28 of layer 26 is removed by etching, thereby exposing a portion of the surface of epitaxial layer 25. The remaining portions of layer 26 form a mask for subsequent emitter diffusion. Referring to FIG. 9, emitter region 30, having an N+ type conductivity, is diffused into epitaxial layer 25 using oxide layer 26 as a mask. Any N-type impurity may be employed, for example, phosphorus, arsenic or antimony. The device is then subjected to another oxidizing process, resulting in a layer of oxide 32 over the entire surface of the device. This is shown in FIG. 10.

Figure 11:
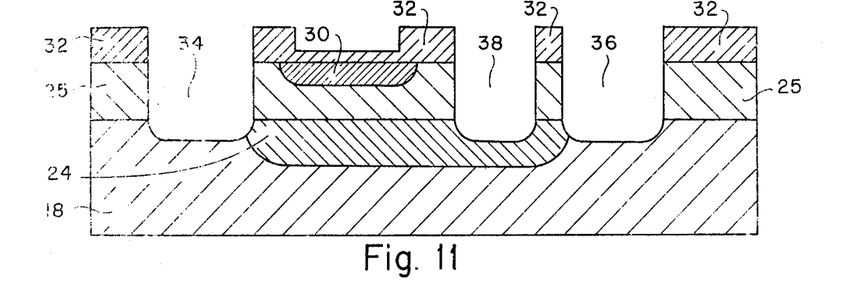

Selected regions of oxide layer 32 are then removed over regions which will correspond to both the isolation moats and the sink hole for contacting the buried layer. Using the remaining portions of oxide layer 32 as a mask, the exposed P-type epitaxial layer and portions of the substrate and buried layer are etched away. FIG. 11 illustrates the resulting isolation moats 34 and 36 and sink hole 38.

Figure 12:
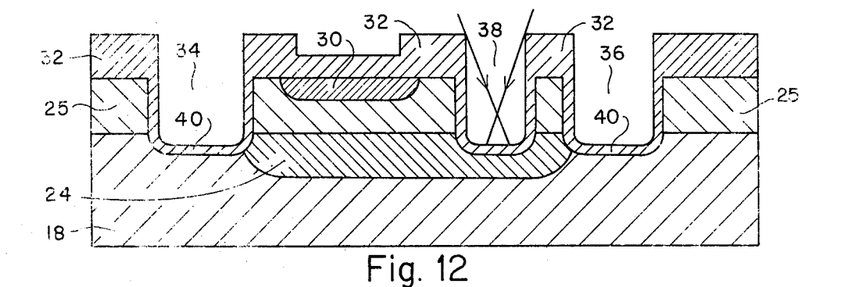

Next, referring to FIG. 12, an oxide layer 40 having a thickness of approximately 2500 angstroms is produced and covers both the sink hole and the isolation areas. A light boron doping may be used during this oxidization step to suppress inversion.

After emitter oxidization, a coating of a negative photoresist, for example, a Wheyco negative resist, is spun onto the wafer, and the photoresist is exposed by a collimated light source at a directional angle as shown in FIG. 12. It can be seen that only the photoresist at the bottom of the sink hole is unexposed. The area of the unexposed region may be regulated by the angle of incidence of the collimated light source. Since the width of the isolation moats is larger than the width of the sink hole, no area of the isolation moat will be left unexposed at a chosen angle of incidence of the light beam.

Figure 13:
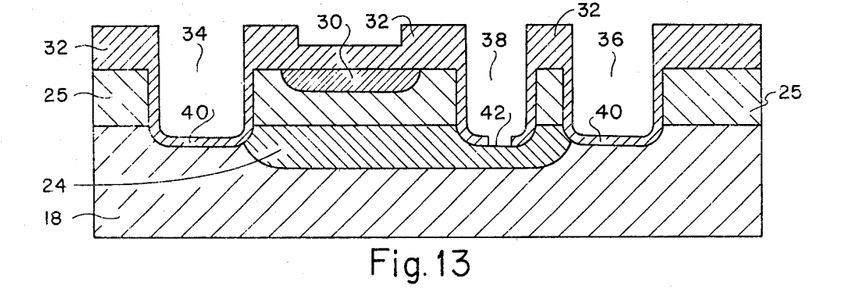

Next, that portion of the negative photoresist which was unexposed is removed during developing and the exposed oxide area is subsequently etched, thereby exposing the buried collector 24 (FIG. 13).

Figure 14:
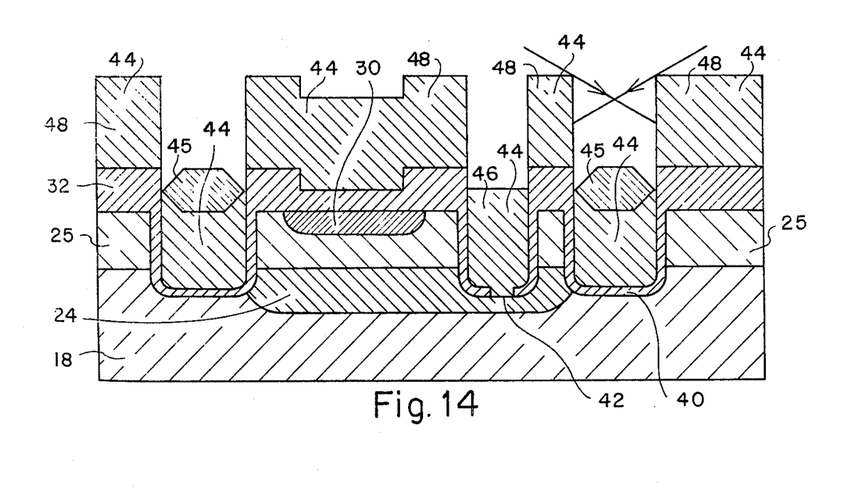

Referring to FIG. 14, a metal, preferably aluminum is evaporated onto the surface of the structure so as to form a conductive coating 44 on oxide layer 40 and on the exposed surface 42 of buried layer 24.

As can be seen from FIG. 14, a metal contact 46 has been made directly to buried layer 24. The metal coating deposited in the isolation moats 34 and 36 is then selectively anodized to form a dielectric material 45 for electrical isolation between adjacent active elements, as shown in FIG. 14. As stated previously, this is accomplished by applying the positive potential to the metal in the isolation moats and may be accomplished as described above in conjunction with FIG. 2. Further, the metal in sink hole 38, which contacts buried layer 24, is in no way coupled to the metal in the isolation moats and therefore remains unanodized. Further, those portions of the metal layer denoted by numerals 48 are also not coupled to the metal in the isolation moats during anodization and likewise remains unanodized.

Figure 15:
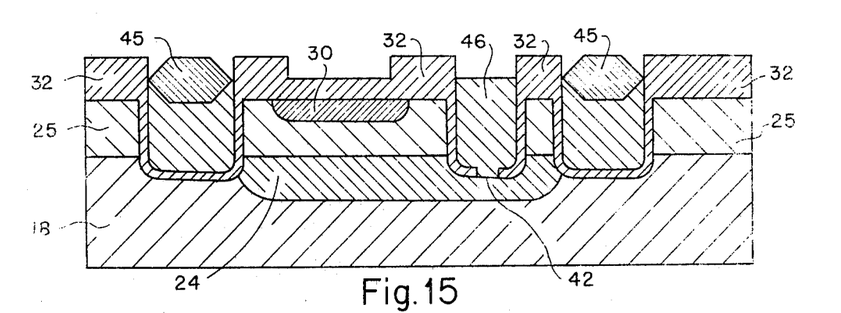
Figure 16:
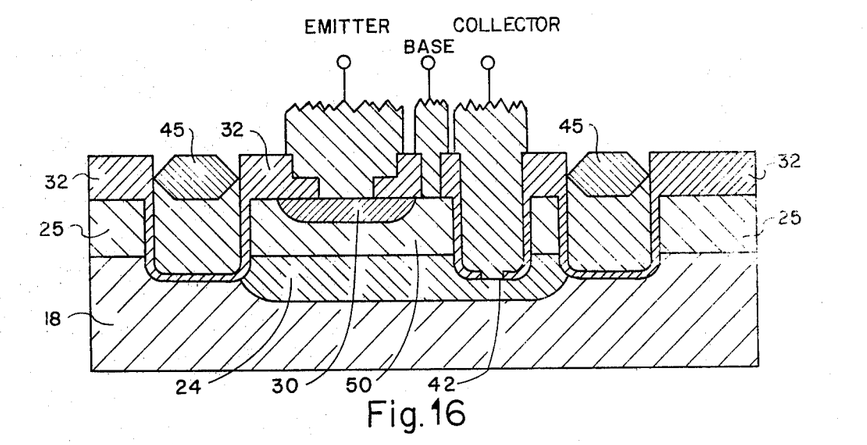

Next, using a positive photoresist, for instance, a Shipply photoresist, the exposed surfaces of the device are exposed to a collimated beam of light at a shallow angle as shown in FIG. 14. This time, the unexposed portions of the resist remain during developing and the exposed resist areas are washed away. Subsequently, the unanodized aluminum in regions 48, which were exposed to the collimated light source, are removed using a compound which attacks the aluminum such as a ferric chloride or bromine compound. Clearly, the unanodized aluminum in regions 48 could have been removed prior to anodization. This would completely eliminate the possibility of unwanted anodization due to hairline contacts with the aluminum in the isolation moats. FIG. 15 illustrates the resulting structure. Next, employing a penultimate masking and etching process, contact holes to emitter 30 and base 50 are produced, and a contact metal evaporated in accordance with standard and known procedures. Finally, metal is masked and etched for interconnects. The final structure is shown in FIG. 16.

It can be seen that by using a P-type epitaxial layer and anodized aluminum isolation, a transistor structure can be constructed using a total of five masking steps and two diffusion steps only. Also, a thinner epitaxial layer can be used; just thick enough for a given dopant density, thereby resistant to collector/emitter leakages. In summary, P-type epitaxial layer devices having small geometries and high yield can be produced.

Referring back to FIGS. 12 and 14, reference is made to the exposure of a negative or positive photoresist to a collimated beam of light. Exposure to angled incident light can be implemented in several ways.

Figure 17:
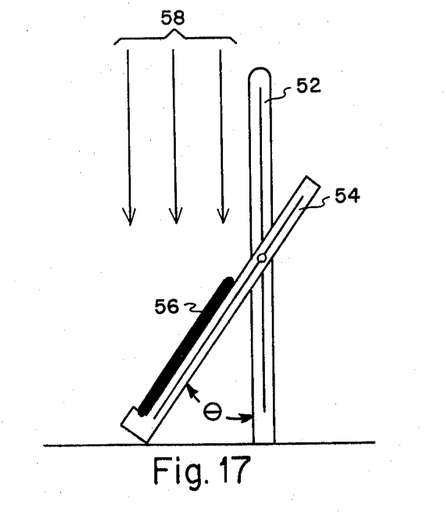
FIGS. 17–19 show three possible methods of exposing a semiconductor wafer to light at a predetermined angle of incidence.

In a first example, shown in FIG. 17, a simple jig 52 has an adjustable wafer holder 54. Holder 54 can be adjusted in order to expose wafer 56 to the collimated light source 58 at some predetermined angle $\theta$. To accomplish full exposure, the wafer may be exposed one-fourth of the total exposure time required for a total of 4 times, each time rotating wafer 56 by 90°.

Figure 18:
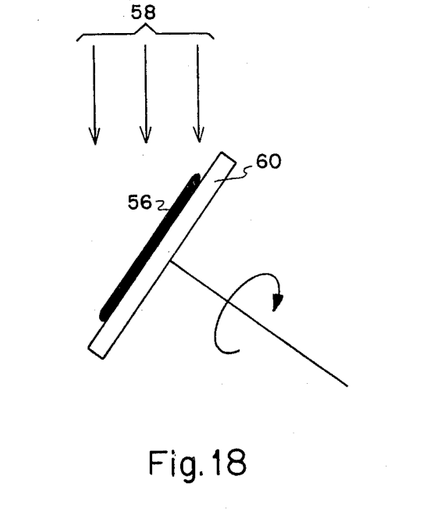

A second technique is shown in FIG. 18. Wafer 56 is attached to a spinner 60, which spinner is adjusted to achieve the required angle of incidence. The wafer 56 is spun throughout the entire exposure time.

Figure 19:
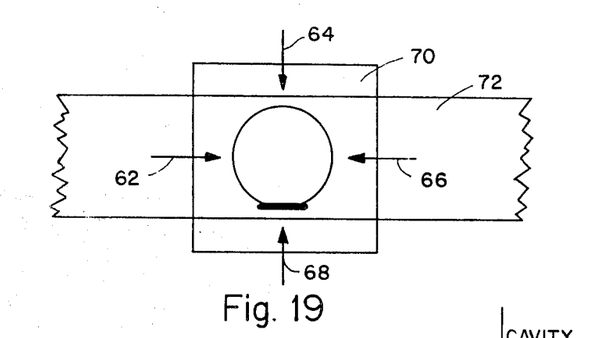

A third method requires the use of four orthogonally mounted light sources 62, 64, 66 and 68 angled towards the wafer as required. The wafer may then be fed into an exposure chanber 70 via a belt drive 72. The speed of the belt drive carrier 72 is adjusted to insure that the wafer 56 will remain in the exposure chamber 70 for the required length of time. This is shown in FIG. 19.

In the case of elongated cavities, special consideration must be given. Square-shaped cavities require exposure to incident light at only one angle and therefore all three of the above described implementations are applicable. However, the problem of unwanted exposure as depicted in FIG. 20 may occur in the case of an elongated cavity if a single source of incident light at a single angle of incidence is employed.

Figure 20:
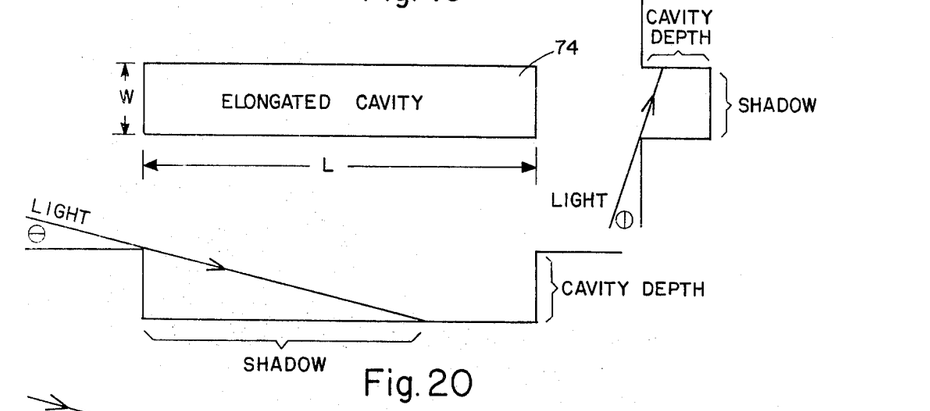
FIGS. 20–22 illustrate the problem of exposing elongated cavities to a collimated light source and means for overcoming said problem.

FIG. 20 illustrates an elongated cavity 74 having a length L substantially greater than its width W. FIG. 20 also illustrates the shadow patterns when a collimated light source is incident upon the cavity at an angle $\theta$ in a direction parallel to its length and at the same angle $\theta$ parallel to its width. Clearly, it will be seen that certain portions of the cavity will be insufficiently exposed.

It has been found that by employing the spin exposure technique, even elongated cavities can be selectively exposed. In the case of elongated cavities, it is preferable to employ an incident light beam having a small angle of incidence, e.g., 3° to 5°.

Figure 21:
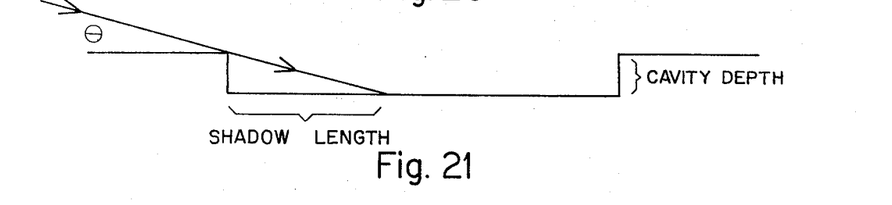

A typical cavity width, common in integrated circuits, is approximately 5 to 10 $\mu m$; cavity depths vary from approximately 2 $\mu m$ to 10 $\mu m$. Table I illustrates the maximum elongation permissible for zero exposure at the bottom of the cavity for a 4° incident light beam. Table I illustrates the relationship between cavity depth and shadow length as shown in FIG. 21.

TABLE I

| 4° INCIDENT ANGLE | |
|---|---|
| Cavity Depth ($\mu m$) | Shadow Length ($\mu m$) |
| 2 | 28.57 |
| 4 | 57.14 |
| 6 | 85.71 |
| 8 | 114.29 |
| 10 | 142.86 |

Figure 22:
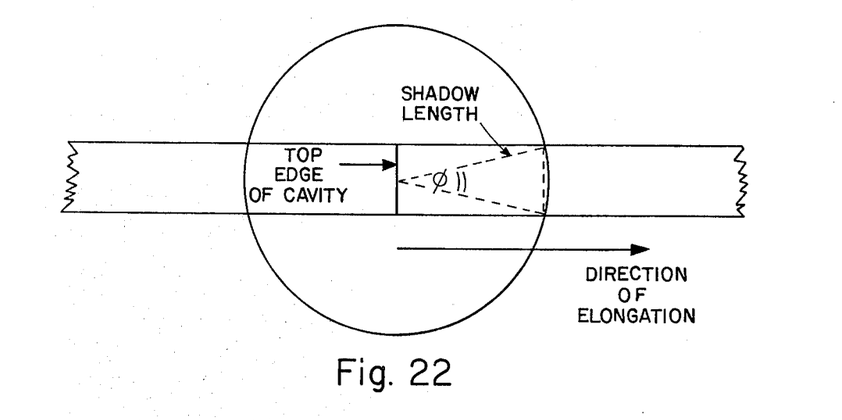

The only question which remains relates to the exposure of the bottom of the elongated cavity beyond the shadow length. By spinning the wafer, that part beyond the shadow length will be exposed to light during only a fraction of the exposure time. The effect of exposure time can be estimated using the model shown in FIG. 22 which shows an elongated cavity having a width W. The percent effective exposure time is equivalent to $(\phi/360°) \times 100$.

Table II illustrates the approximate effective exposure time beyond the shadow length as a function of cavity width for an elongated cavity having typical depth values, i.e., 2 μm, 6 μm, and 10 μm.

TABLE II

| | 4° INCIDENT ANGLE | | | | | |
|---|---|---|---|---|---|---|
| Cavity | % effective exposure time beyond shadow length for different cavity width (1 < shadow length < 2) | | | | | |
| Depth | 5 μm | 8 μm | 10 μm | 15 μm | 30 μm | 60 μm |
| 2 μm | 3% | 4% | 6% | 8% | 16% | 26% |
| 6 μm | 1% | 2% | 2% | 3% | 6% | 11% |
| 10 μm | 1% | 2% | 2% | 2% | 3% | 7% |

Of course, the tolerable effective exposure time will be dependent upon the type of photoresist. Further, because exposure takes place at a small incident angle, the photoresist will appear thicker and therefore, allowance must be made to provide for additional exposure time as required.

To simplify the fabrication of the above described semiconductor device, a double exposure technique may be employed. Referring to FIG. 12, a first mask is employed which allows exposure of the negative photoresist on all parts of the wafer except within the sink cavity 38. Then, a second exposure is performed to provide the desired amount of exposure to the vertical walls of the sink cavity. This is accomplished by using an angled incident light beam as described hereinabove with reference to FIGS. 17-19. Next, the photoresist on the wafer is developed. This technique insures that none of the oxide layer 40 within the isolation moats 34 and 36 will be etched away during subsequent etching of the sink oxide. This technique further insures that the bottom of sink cavity 38 suffers no unwanted exposure in an effort to fully expose the isolation moats. This remains true even if the widths of the isolation moats are the same or less than the width of the sink cavity. The aluminum on the top of the wafer (see FIG. 14) is removed prior to anodization of the aluminum inside the isolation moats using a positive photoresist as described hereinabove. This insures that none of the surface aluminum is unintentionally anodized. This further eliminates the need for ferric chloride to remove the aluminum and allows the use of a standard aluminum etch.

As stated previously, it should be clear that the above technique can be employed to provide direct metal contacts to a substrate from the top of a wafer surface when no buried layers are provided. For example, insulator isolated processes in general require a P+ deep "sink" through the N-type epitaxial layer to obtain direct contact to the P+ type substrate from the top of the wafer. Clearly, the method of direct metal contact to the collector can be applied to the substrate case also. However, in the substrate case, (or collector for that matter) the metal in the sink hole need be only thick enough to "short circuit" the p-n junction, and the metal contact may be made from the top of the wafer, instead of contacting the metal in the sink-hole.

The following is a description of an alternative embodiment employing the inventive concepts which avoids the necessity of an oxide layer on the walls of the sink hole. The steps of fabrication are the same as described above with reference to FIGS. 3-10.

Figure 23:
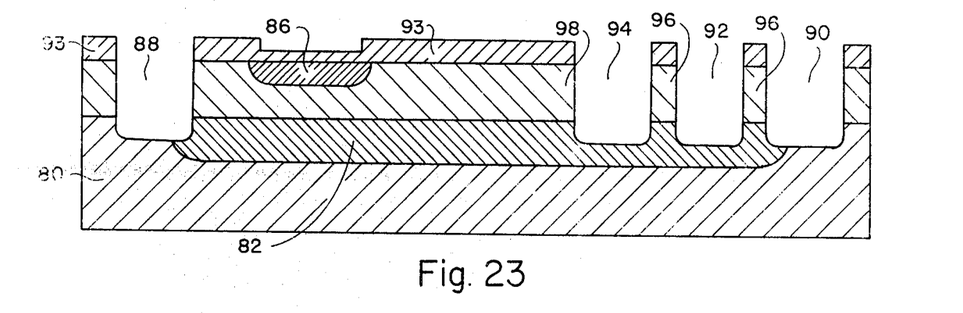
FIGS. 23–25 are cross-sectional views of a portion of an integrated circuit shown at various stages of fabrication in accordance with a second embodiment of the present invention.

Again, selected regions of the emitter oxidation layer are removed over regions which will correspond to both the isolation moats and the sink hole for contacting the buried layer. However, an additional moat is etched which will provide isolation between the sink hole and the P-type base of the transistor. The resulting structure is shown in FIG. 23. The structure comprises a P-type substrate 80, a buried collector having an N+ type conductivity 82, a P-type base region 98, an N+ type emitter region 86, isolation moats 88 and 90, sink hole 92, an emitter oxidation layer 93, and a newly added separation moat 94. It should be clear that separation moat 94 separates the P-type epitaxial region surrounding the sink hole 96 from the P-type epitaxial region 98 forming the base of the transistor.

Figure 24:
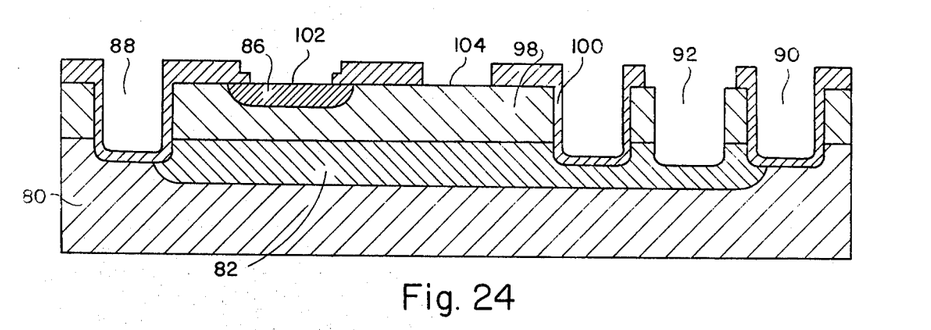

Next an oxide layer 100 is produced and covers the sink hole, the separation moat and the isolation moats. Using a contact mask, and a standard photoresist technique, the oxide in the sink hole is partially removed, and contact windows 102 and 104 are opened. The resulting structure is shown in FIG. 24.

Figure 25:
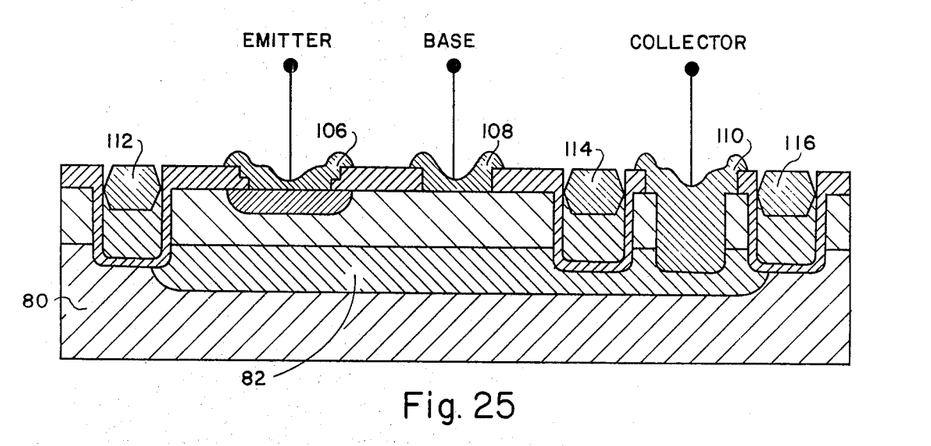

As in the first embodiment, a metal is then evaporated on the device and using the above described photoresist techniques, the unwanted aluminum is removed. The aluminum in the isolation moats of the separation moat is then anodized as above described and aluminum contacts are evaporated and cut. The final structure is as shown in FIG. 25. Contacts 106, 108 and 110 contact the emitter, base and collector respectively of the transistor. Both the isolation moats and the separation moats contain anodized aluminum regions 112, 114 and 116. It will be noted that the oxide layer required in the first embodiment is not present in the structure shown in FIG. 25. This is possible due to the presentation of the separation moat which, in effect, electrically isolates P-type base region 98 from those portions of the P-type epitaxial layer which surround the direct metal contact 110.

While the principles of the invention have been described above in connection with specific apparatus, it is to be clearly understood that this description is made only by way of example and not as a limitation on the scope of the invention.

What is claimed is:

1. A method of providing a direct metal contact to a buried region of a semiconductor device of the type wherein an intermediate layer is formed over said buried region, said intermediate layer having a first type conductivity and said buried region having a second type conductivity, comprising:

forming spaced regions of a first protective layer on said intermediate layer;

forming an opening in said intermediate layer using said spaced regions as a mask, thus exposing said buried region;

forming a second protective layer of dielectric material in said opening for coating said opening and said exposed buried region;

removing a portion of said second layer at the bottom of said opening for exposing said buried region, said step of removing comprising:

applying a negative photoresist to the surface of said second layer;

exposing said negative photoresist to a collimated beam of light at an angle of incidence such that the negative photoresist on said portion remains unexposed;

developing the exposed photoresist; and removing said portion of said second layer beneath said unexposed negative photoresist; and filling said opening with metal, said metal contacting the exposed buried region forming said direct contact.

2. A method according to claim 1 wherein said forming of spaced regions comprises:

forming said first protective layer on said intermediate layer; and removing selected portions of said first protective layer.

3. A method according to claim 2 wherein said selected portions are removed by etching.

4. A method according to claim 1 wherein said opening in said intermediate layer is removed by etching.

5. A method according to claim 1 wherein said filling comprises:

depositing a layer of metal over said device, thereby depositing said metal layer on said first protective layer and filling said opening;

depositing a positive photoresist on said metal layer;

exposing unwanted metal without said opening to a collimated light source such that the metal in said opening remains unexposed;

developing said positive photoresist; and removing unwanted metal under the exposed positive photoresist.

6. A method according to claim 5 wherein said buried region is diffused into a substrate of semiconductor material and further including the steps of:

forming a plurality of openings simultaneously with said first opening, each of said plurality exposing said substrate;

coating the surface of each of said plurality of openings with said second layer;

depositing a metal in each of said plurality of openings; and anodizing the metal in each of said plurality of openings to provide electrical isolation.

7. A method according to claim 6 wherein said intermediate layer is an epitaxial layer forming the base of a transistor and said buried layer forms a collector of said transistor and where an emitter region is disposed beneath said first protective layer and within said epitaxial layer.

8. A method according to claim 7 further including:

opening contact windows through said first protective layer to expose said base and said emitter; and forming metal contacts to said base and emitter.

9. A method according to claim 8 wherein said metal is aluminum deposited by evaporation.

10. A method according to claim 6 wherein said anodizing takes place after the unwanted metal is removed from said first protective layer.

* * * * *